United States Patent [19]

Freiberg

[11] 4,412,739

[45] Nov. 1, 1983

[54] HINGED GLASS PHOTOMASK ASSEMBLY

[75] Inventor: James M. Freiberg, New Kensington, Pa.

[73] Assignee: PPG Industries, Inc., Pittsburgh, Pa.

[21] Appl. No.: 224,782

[22] Filed: Jan. 13, 1981

[51] Int. Cl.³ .............................................. G03B 27/04
[52] U.S. Cl. .................... 355/89; 355/132; 16/225; 430/321
[58] Field of Search ............ 355/75, 79, 91, 93, 355/125, 133, 132; 430/5, 321, 396; 16/225

[56] References Cited

U.S. PATENT DOCUMENTS

| | | | |
|---|---|---|---|
| 2,829,081 | 4/1958 | Sweem | 16/225 |
| 3,441,975 | 5/1969 | Shepherd | 16/225 |
| 3,877,808 | 4/1975 | Jasperson | 355/132 |
| 3,881,303 | 5/1975 | Krafka et al. | 16/225 |
| 3,927,943 | 12/1975 | Pohl et al. | 355/132 |
| 4,032,233 | 6/1977 | Oscarsson et al. | 355/91 |
| 4,144,066 | 3/1979 | Ernsberger | 430/321 |
| 4,155,735 | 5/1979 | Ernsberger | 430/321 |
| 4,159,176 | 6/1979 | Masi | 355/79 |

Primary Examiner—A. A. Mathews
Attorney, Agent, or Firm—Donna L. Seidel

[57] ABSTRACT

A method and article are disclosed for facilitating repeated use in a photolithographic imaging process of a photomask assembly comprising a pair of glass plates by means of a flexible polymeric hinge permanently joining said pair of glass plates.

6 Claims, 3 Drawing Figures

HINGED GLASS PHOTOMASK ASSEMBLY

BACKGROUND OF THE INVENTION

The present invention relates generally to the art of producing printed circuits and the like by photolithographic processes using photomasks, and relates more particularly to the art of facilitating repeated use of a photomask assembly comprising a pair of glass plates.

A printed circuit board comprises a substrate of insulator material and a circuit pattern of conductive material commonly formed by photolithographic processes. For example, a fiberglass board to be printed with circuitry is plated with copper and coated with a layer of photoresist material, a photosensitive polymer. The coated surface is then exposed to actinic radiation through a photomask master, a plate with some areas which are transparent to the actinic radiation and some areas which are not, which defines the desired circuit pattern. The pattern is developed as a relief image in the photoresist by solvent treatment, the exposed and unexposed portions of the photosensitive polymer having different solubilities. The printed substrate may be either a positive or negative image of the photomask master depending on whether a positive or negative working photopolymer is used. Typically, the unexposed photoresist is removed and the underlying copper etched away to leave a pattern of conductive copper in the image of the transparent pattern of the photomask.

Photomasks used in photolithographic processes such as the manufacture of printed circuits are preferably glass plates coated with photographic emulsion, iron oxide or chromium having a pattern of transparent and opaque areas (transparent and opaque with respect to actinic radiation). These photomasks must be repeatedly registered in relation to photoresist coated substrates to accurately reproduce the desired pattern. For this reason, durable but opaque films such as chromium may be less preferred than less durable but transparent films (transparent and opaque with respect to visible light). The visually aligned assembly is exposed to radiation which passes through the transparent areas of the photomask to photographically impose a pattern on the coated substrate, which is typically developed as a relief image by dissolution of the unexposed photosensitive material. However, in the alternative, the exposed coating material may be removed by dissolution, or either the exposed or unexposed areas may be chemically treated. The chemistry of photolithographic processes is well-known, and any of the conventional routes is acceptable to arrive at a circuit pattern on the substrate.

For high volume production, more durable photomasks have been developed wherein the pattern is a stained image within a glass plate, rather than a coating. These photomasks may be used many times in a photolithographic imaging process to produce high resolution patterns. In many current applications, it is also useful to reduce the size of printed circuit boards by increasing the density of conductive lines, which requires increasing resolution, or by producing patterns on both sides of a substrate. Both increasing the resolution of a dense pattern and simultaneously printing both sides of a circuit board may be accomplished using a pair of glass photomasks precisely registered on opposite sides of a photoresist coated substrate.

When both sides of photoresist coated substrates are to be printed simultaneously in a high volume commercial operation, a durable dual photomask assembly which can be repetitiously aligned quickly and accurately with minimum handling and risk of breakage of the glass plate is required.

An apparatus typically employed in the photolithographic processes described above generally comprises a pair of frames defining an enclosed space which can be evacuated. A pair of flexible photolithographic masters may be visually aligned and manually secured individually to the frame members by such devices as tape, clamps or spring clips. However, glass photomasks are typically registered using cylindrical alignment pins fitted through holes drilled through corresponding areas of the glass plates. A photopolymer coated substrate is precisely registered between the photomasks, and the assembly is subjected to vacuum and exposed to actinic radiation. When the substrate is removed from the assembly to develop the circuit pattern, the top glass plate must be lifted vertically and set aside until it is replaced over a fresh substrate. This process is costly, time-consuming and inaccurate, with the glass exposed to high risk of breakage. Therefore, improvements to the visual-manual registration technique have been sought.

For example, U.S. Pat. No. 4,032,233 to Oscarsson et al describes an apparatus which facilitates the registry of image bearing transparencies with a plate having a photosensitive coating thereon. The registry apparatus includes upper and lower frames forming an enclosure on which the plates and transparencies are placed in sandwich relation. An outer gasket between the frame permits a vacuum to be applied to the enclosed space, while an inner perimeter channel permits a separate vacuum to hold the transparencies in place while the frames are opened to remove, insert or replace a plate.

U.S. Pat. No. 3,927,943 to Pohl et al discloses contact printing on opposite sides of a sensitized substrate by mounting first and second masks in first and second support members, adjusting the first support member to align the masks with respect to a common alignment pin, removing the second support member, mounting the substrate in a third support member, aligning the substrate with the first mask, forcing the substrate into contact with the first mask and magnetically holding it in place, removing the third support member, fastening the second support member to the first support member with the alignment pin, and drawing a vacuum between the masks to bring them into contact with opposite sides of the substrate.

SUMMARY OF THE INVENTION

The present invention provides for simple, efficient and accurate repeated use of a photomask assembly comprising a pair of glass sheets by means of a durable hinged photomask assembly. The hinged photomask assembly of the present invention provides simple, efficient and accurate repeated use of a pair of glass plates with minimum risk of glass breakage. The photomask assembly of the present invention comprises a pair of glass plates, at least one photomask image, and a flexible polymeric hinge. The assembly preferably also comprises a hinge plate, bonded to one of the glass plates and to the polymeric hinge which is bonded to the other glass plate.

DETAILED DESCRIPTION OF THE PREFERRED EMBODIMENT

Figure 1:
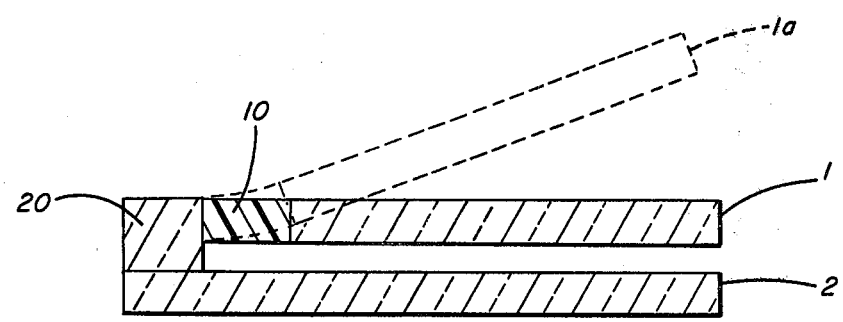
FIG. 1 is a cross-sectional view of the preferred hinged photomask assembly. Top glass plate 1 is bonded to one edge of flexible polymeric hinge 10, the other edge of which is attached to hinge plate 20 which is affixed to bottom glass plate 2. Either or both of glass plates 1 and 2 may comprise a photomask image either in the form of a coating or as a stain pattern within the glass.

Two glass plates are joined by a flexible polymeric hinge to form a permanent photomask assembly according to the following procedure, by which the preferred article of FIG. 1 is produced.

Glass plates are cleaned, preferably with pumice and water. When the pumice is dry, the surfaces are wiped clean with a lint-free cloth or paper towel. A clean plate is preferably placed in a horizontal position on a supporting fixture. The polymeric hinge material, preferably in the form of an extruded bead, is placed on the supporting fixture along the edge of the glass plate. The width of the bead is preferably slightly larger than the desired final width of the hinge. The area of the supporting fixture underlying the polymeric hinge material is preferably coated with a release film such as TEFLON ® polytetrafluoroethylene. A hinge plate, preferably a narrow strip of glass about the same length as the glass plate but preferably only about ¾ inch (about 19 millimeters) wide, commonly referred to as a glass butt, is placed on the supporting fixture and pressed into the polymeric hinge material which is compressed between the hinge plate and the glass plate to the desired final hinge width. Preferably, the polymeric hinge material is a silicone composition with can be cured to form a flexible hinge which adheres to the glass. In this case, a cover is preferably clamped over the hinge assembly. The supporting fixture carrying the glass plate, polymeric hinge material and hinge plate is placed in an oven to cure the polymeric hinge material. When the polymeric hinge material is cured, the assembly is cooled to room temperature and tested, by bending the sample 90°, to determine the flexibility of the polymeric hinge and its adhesion to the glass plate and hinge plate. In a most preferred embodiment of the invention, this assembly is then joined to a second glass plate by bonding the hinge plate to the second glass plate to form a permanent photomask assembly as illustrated in FIG. 1.

The photomask portion of the assembly may be a patterned coating of photographic emulsion, iron oxide or chromium on either or both of the glass plates, or any conventional photomask material. However, it is preferred that one or both of the glass plates bear a photomask image in the form of a stain pattern within the glass plate. A preferred photomask plate may be prepared by coating a glass plate with a photographic emulsion comprising a dispersion of silver halide in gelatin which is exposed to light through a master pattern. Exposed areas of the photograhic emulsion form a latent image which is further developed by immersion in developing solutions which convert the silver halide to colloidal silver, while the unexposed emulsion is removed. The silver coated glass plate is subjected to conditions which cause migration of silver ions into the glass. While heat alone may be sufficient, preferably electron bombardment or an electric field is employed to minimize diffusion of the pattern. The silver ions are then reduced to elemental silver and agglomerated into colloidal microcrystalline color centers which form a stain pattern within the glass. The reduction and agglomeration of silver are preferably accomplished by heating in the presence of reducing ions, such as copper ions or the tin ions found in many glass compositions.

Most glass compositions are useful in accordance with the present invention with respect to the polymeric hinge. In preferred embodiments wherein the glass plate comprises a photomask image in the form of an internal stain pattern, the glass composition requires mobile cations which migrate under the conditions imposed for migration of the silver ions, in order to provide sites for the silver ions within the glass. Typical soda-lime-silica glass compositions contain an abundant supply of mobile alkali metal ions, while typical float glass compositions contain, in addition to mobile alkali metal ions, tin ions which may be utilized to reduce the silver ions migrated into the glass from the photographic emulsion.

Photographic emulsions useful in accordance with preferred embodiments of the present invention are those which, upon exposure and development, produce a pattern containing silver with sufficient electrical conductivity to facilitate electromigration of silver ions into the glass in order to avoid the pattern diffusion associated with thermal migration. In addition, the photographic emulsion should itself have high resolving power in order to maximize the resolution of the pattern reproduced in the photomask plate. Detailed descriptions of methods for forming glass photomasks which are preferred for use in accordance with the present invention are found in U.S. Pat. Nos. 4,144,066 and 4,155,735 to Ernsberger, the disclosures of which are incorporated herein by reference.

In most preferred embodiments of the present invention, both glass plates are photomask plates and precise registration of the plates is crucial. Therefore, the polymeric hinge material must be flexible and compressible enough to accommodate variations in thickness of the substrates to be printed without stretching or loosening with repeated usage. Polymeric materials useful in accordance with the present invention therefore must be flexible, but not deformative in the cured state, and must be adherent to glass. Preferred polymeric compositions include silicones, preferably in the form of an extruded bead, as disclosed in U.S. Ser. No. 224,784 filed Jan. 13, 1981 by G. H. Bowser and commonly assigned, entitled "Silicone Compositions for Photomask Assembly Hinge", the disclosure of which is incorporated herein by reference. Preferred silicone compositions in accordance with the present invention include phenyl-methyl-vinyl siloxane polymers and preferably further include a curing agent and an adhesion promoter. A preferred curing agent is benzoyl peroxide and a preferred adhesion promoter is glycidoxypropyltrimethoxysilane. The preferred silicone compositions typically cure at moderate temperature in relatively short times to a Shore A hardness of about 25 to 70, preferably about 30 to 50. A preferred registration system for a hinged photomask assembly in accordance with the present invention comprises a tapered alignment pin assembly.

The present invention will be further understood from the description of specific examples which follow.

EXAMPLE I

Soda-lime-silica float glass plates are washed with pumice and water, dried and wiped clean with lint-free towels. A glass plate is placed in a horizontal position on a supporting frame. A silicone extrusion product ½ by 3/16 inch (about 12.7 by 4.8 millimeters) is placed along the edge of the glass plate. The area of the supporting fixture under the silicone bead is coated with TEFLON® polytetrafluoroethylene. The silicone composition comprises 100 parts by weight of a silicone rubber available as Silastic 1125 U from Dow Corning, 0.8 parts by weight of 50 percent benzoyl peroxide in silicone oil available as Cadox BS Paste for Nourly Chemical Corporation, and 1.0 parts by weight of glycidoxypropyltrimethoxysilane available as Z-6040 from Dow Corning. A glass hinge plate ¾ inch (about 19 millimeters) wide is placed in a horizontal position on the supporting fixture and is pressed into the silicone extrusion compressing it to a thickness of ⅜ inch (9.5 millimeters) against the glass plate. A cover is placed over the hinge and secured with bookbinder clamps. The supporting fixture carrying the glass plate, silicone hinge and hinge plate is placed in an oven at 300° F. (about 139° C.) for 20 minutes. The assembly is then removed from the oven and cooled to room temperature. The hinge, tested by bending to 90°, exhibits good flexibility and adhesion to the glass and has a Shore A hardness of 50. The hinged assembly is then affixed to a second glass plate by bonding the hinge plate to a second glass plate as shown in FIG. 1 using a cyanoacrylate composition available from the Loctite Corporation as Loctite 352 speed bonder, which is cured by exposure to ultraviolet radiation.

EXAMPLE II

A hinged glass photomask assembly is prepared as in Example I using a polymeric hinge composition which comprises 100 parts by weight of Silastic HS-30, a silicone rubber available from Dow Corning; 0.8 parts by weight Cadox BS, a 50 percent benyzoyl peroxide solution in silicone fluid available from Nourly Chemical Corporation; and 1.0 parts by weight Z-6040, an organofunctional silane from Dow Corning. This silicone composition cures at 300° F. (about 139° C.) to form a flexible adherent hinge with a Shore A hardness of 30.

Figure 2:
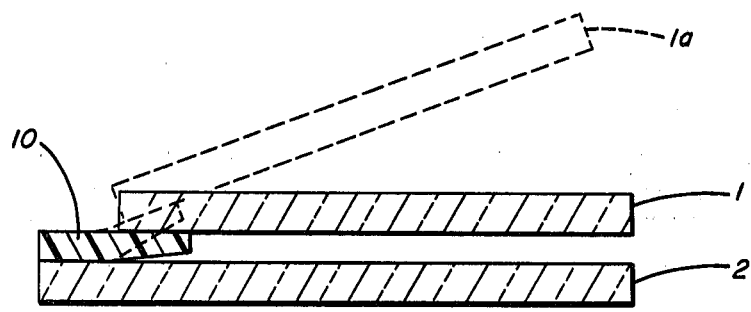
FIG. 2 depicts an alternate assembly which does not comprise a hinge plate. Top glass plate 1 is bonded on its bottom surface to a portion of the top surface of flexible polymeric hinge 10, a portion of the bottom surface of which is bonded to the top surface of bottom glass plate 2.
Figure 3:
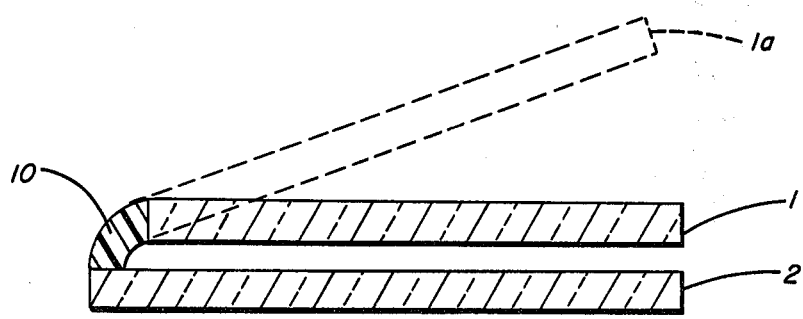
FIG. 3 represents another alternate assembly which does not comprise a hinge plate. Top glass plate 1 is bonded to one edge of flexible polymeric hinge 10, the other edge of which is bonded to bottom glass plate 2. In this assembly, the hinge is flexed in the closed position whereas in the assemblies illustrated by FIGS. 1 and 2, the hinge is flexed in the open position.

The above examples are offered to illustrate the present invention which includes various modifications. For example, flexible polymers other than silicone may be employed, may be cured by means other than heat, and may be bonded to glass using primers. As previously mentioned, the photomask may be in any known form but is preferably a stained pattern in one or both glass plates. Other configurations, such as those illustrated in FIGS. 2 and 3, may be produced. Any means of registration may be used to align the photoresist coated substrate within the hinged photomask assembly of the present invention, the scope of which is defined by the following claims.

I claim:

1. An article of manufacture for use in photolithograhic processes which comprises:
 a. two glass sheets;
 b. at least one photomask image; and
 c. a flexible polymeric hinge, wherein said polymeric hinge is directly bonded to both glass sheets.

2. An article of manufacture for use in photolithographic processes which comprises:
 a. two glass sheets;
 b. at least one photomask image;
 c. a flexible polymeric hinge; and
 d. a hinge plate,
wherein said polymeric hinge is directly bonded to one of said glass sheets and to said hinge plate which is affixed to the other of said glass sheets.

3. The article according to claim 1 or 2, wherein said polymeric hinge comprises a silicone rubber.

4. The article according to claim 3, wherein said silicone rubber has a Shore A hardness of about 25 to 70.

5. The article according to claim 1 or 2, wherein at least one of said glass sheets comprises a photomask image as a stain pattern within said glass sheet.

6. A method for producing a hinged photomask assembly for use in a photolithographic process which comprises joining two glass plates with a flexible polymeric hinge, wherein one glass plate is a photomask plate and the other glass plate is a hinge plate which is affixed to a second glass photomask plate.

* * * * *